(12) United States Patent
Kim et al.

(10) Patent No.: US 11,971,757 B2
(45) Date of Patent: Apr. 30, 2024

(54) ELECTRONIC DEVICE COMPRISING FIRST AND SECOND NON-DISPLAY AREAS EACH HAVING A TRANSMITTANCE BASED ON AN ARRANGEMENT DENSITY OF DRIVING CIRCUITS AND WIRING STRUCTURES INCLUDING AN OPTICAL SENSOR MODULE

(71) Applicant: SAMSUNG ELECTRONICS CO., LTD., Suwon-si (KR)

(72) Inventors: Jongah Kim, Suwon-si (KR); Jeongho Cho, Suwon-si (KR); Heewoong Yoon, Suwon-si (KR); Donghan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 960 days.

(21) Appl. No.: 16/928,260

(22) Filed: Jul. 14, 2020

(65) Prior Publication Data
US 2021/0026419 A1    Jan. 28, 2021

(30) Foreign Application Priority Data
Jul. 24, 2019   (KR) .................. 10-2019-0089816

(51) Int. Cl.
*G06F 1/16*      (2006.01)
*G01S 7/481*     (2006.01)
(Continued)

(52) U.S. Cl.
CPC .......... *G06F 1/1686* (2013.01); *G01S 7/4813* (2013.01); *G01S 7/51* (2013.01);
(Continued)

(58) Field of Classification Search
CPC ............................... G01S 7/51; G02F 1/13312
See application file for complete search history.

(56) References Cited

U.S. PATENT DOCUMENTS 9,874,907 B2     1/2018  Wang
2013/0094184 A1  4/2013  Lee
(Continued)

FOREIGN PATENT DOCUMENTS

CN   107390780 A  * 11/2017   .......... A61B 5/1172
CN   108600421       9/2018
(Continued)

OTHER PUBLICATIONS

International Search Report dated Oct. 13, 2020 in counterpart International Patent Application No. PCT/KR2020/009167.
(Continued)

*Primary Examiner* — Paul C Lee
(74) *Attorney, Agent, or Firm* — NIXON & VANDERHYE P.C.

(57) ABSTRACT

In embodiments, an electronic device may include a housing, a display panel, and an optical sensor module. The display panel is disposed in an inner space of the housing and is at least partially visible from an outside through the housing, the display including a display area, a first non-display area disposed adjacent to at least a peripheral portion of the display area, and a second non-display area disposed adjacent to at least a peripheral portion of the first non-display area. The optical sensor module is disposed in the inner space at least partially overlapping the display panel, and includes a flexible printed circuit board (FPCB), a light emitting structure disposed on the FPCB at least partially overlapping the first non-display area when the display panel is viewed from above, and a light receiving structure disposed on the FPCB at least partially overlapping the display area when the display panel is viewed from above. The display area has a first transmittance, and the first non-display area has a second transmittance greater than the first transmittance.

16 Claims, 12 Drawing Sheets

(51) Int. Cl.
*G01S 7/51* (2006.01)
*G01S 17/10* (2020.01)
*H05K 1/18* (2006.01)

(52) U.S. Cl.
CPC ............ *G01S 17/10* (2013.01); *G06F 1/1637* (2013.01); *G06F 1/1658* (2013.01); *H05K 1/189* (2013.01); *H05K 2201/10121* (2013.01); *H05K 2201/10151* (2013.01)

(56) References Cited

U.S. PATENT DOCUMENTS

| | | |
|---|---|---|
| 2014/0118970 A1 | 5/2014 | Kim et al. |
| 2014/0140657 A1* | 5/2014 | Shiraishi ............... G02B 6/4214 385/14 |
| 2016/0054823 A1 | 2/2016 | Kim |
| 2016/0195905 A1 | 7/2016 | Wang |
| 2017/0223482 A1 | 8/2017 | Park et al. |
| 2018/0364869 A1 | 12/2018 | Lee et al. |
| 2019/0057238 A1 | 2/2019 | Hyun et al. |
| 2019/0155502 A1* | 5/2019 | Zhang .................... G01S 17/88 |
| 2020/0209055 A1 | 7/2020 | Greimel-Langauer |
| 2020/0304617 A1 | 9/2020 | Zhang |

FOREIGN PATENT DOCUMENTS

| | | | |
|---|---|---|---|
| CN | 109417577 A * | 3/2019 | ........... G06F 1/1626 |
| EP | 3490233 | 5/2019 | |
| EP | 3716588 | 9/2020 | |
| KR | 10-2014-0055540 | 5/2014 | |

OTHER PUBLICATIONS

Extended European Search Report and Written Opinion dated Nov. 20, 2020 in counterpart European Patent Application No. 20185509.5.

* cited by examiner

ELECTRONIC DEVICE COMPRISING FIRST AND SECOND NON-DISPLAY AREAS EACH HAVING A TRANSMITTANCE BASED ON AN ARRANGEMENT DENSITY OF DRIVING CIRCUITS AND WIRING STRUCTURES INCLUDING AN OPTICAL SENSOR MODULE

CROSS-REFFERENCE TO RELATED APPLICATION

This application is based on and claims priority under 35 U.S.C. § 119 to Korean Patent Application No. 10-2019-0089816, filed on Jul. 24, 2019, in the Korean Intellectual Property Office, the disclosure of which is incorporated by reference herein in its entirety.

BACKGROUND

Field

The disclosure relates to an electronic device including an optical sensor module.

Description of Related Art

One of current trends in developing electronic devices to meet customer's demands is slimming a device body, for example, reducing a thickness of the electronic device. In addition, such electronic devices are being developed to increase their stiffness, strengthen their design aspects, and differentiate their functional features.

To realize a slim electronic device, a plurality of electronic components of the electronic device should be efficiently disposed in an inner space of the electronic device. In addition to this condition, the plurality of electronic components should be properly disposed to reliably perform their functions. In particular, such an efficient arrangement structure inside the electronic device may be further required in case of electronic components related to a large-screen display.

Currently, mobile electronic devices are being improved to relatively increase the area of a display without changing the overall size. Therefore, as the display is being improved to substantially occupy most of the front surface of the electronic device, an optical sensor module such as a proximity sensor module or an illumination sensor module is also being improved to have a corresponding arrangement structure. For example, the optical sensor module may be disposed in the inner space of the electronic device, underlying the display, to detect external environments through a portion of a display area. The optical sensor module may include a light emitting structure and a light receiving structure both of which are disposed in a module housing and spaced apart from each other. For example, the optical sensor module may perform a sensing operation in a manner that the light emitting structure emits light through the display area and then the light receiving structure receives light reflected by external objects.

However, when the optical sensor module is disposed under the display area (e.g., an active area) of the display, a spot phenomenon by the photoelectric effect may occur in the display area because the light emitted from the light emitting structure leaks to a display device (e.g., an OLED device). In addition, when the light emitting structure is disposed under the display area in which transmittance gradually decreases according to depth, sensing performance may be degraded due to crosstalk caused by diffused reflection. Further, in case of partial-off control that turns off a certain portion of the display area for the operation of the optical sensor module, a relatively large portion corresponding to the optical sensor module should be turned off. This is contrary to the efficient operation of the display area.

SUMMARY

Embodiments of the disclosure provide an electronic device including an optical sensor module.

Embodiments of the disclosure provide an electronic device capable of preventing and/or reducing a spot phenomenon from occurring in a display area through an improved arrangement structure of an optical sensor module.

Embodiments of the disclosure provide an electronic device having improved sensing performance through an improved arrangement structure of an optical sensor module.

Embodiments of the disclosure provide an electronic device having improved assembling efficiency through an improved arrangement structure of an optical sensor module.

According to various example embodiments of the disclosure, an electronic device may include: a housing, a display panel, and an optical sensor module. The display panel is disposed in an inner space of the housing to be visible at least in part from an outside through the housing, and includes a display area, a first non-display area disposed adjacent to at least a peripheral portion of the display area, and a second non-display area disposed adjacent to at least periphery peripheral portion of the first non-display area. The optical sensor module is disposed in the inner space at least partially overlapping the display panel, the optical sensor module including a flexible printed circuit board (FPCB), a light emitting structure disposed on the FPCB and at least partially overlapping the first non-display area when the display panel is viewed from above, and a light receiving structure disposed on the FPCB and at least partially overlapping the display area when the display panel is viewed from above. The display area has a first transmittance, and the first non-display area has a second transmittance greater than the first transmittance.

According to various example embodiments of the disclosure, an electronic device may include a housing, a display, and an optical sensor module. The housing includes a transparent cover. The display is disposed in an inner space of the housing to be visible at least in part from an outside through the transparent cover, and includes a display panel including a display area, a first non-display area disposed adjacent to at least a peripheral portion of the display area, and a second non-display area disposed adjacent to at least a peripheral portion of the first non-display area, and at least one additional layer disposed on a rear surface of the display panel. The optical sensor module is disposed in the inner space and attached to a rear surface of the additional layer, the optical sensor module including a flexible printed circuit board (FPCB), a light emitting structure comprising light emitting circuitry disposed on the FPCB and at least partially overlapping the first non-display area when the display is viewed from above, and a light receiving structure comprising light receiving circuitry disposed on the FPCB and at least partially overlapping the display area when the display is viewed from above. The display area has a first transmittance, and the first non-display area has a second transmittance greater than the first transmittance.

BRIEF DESCRIPTION OF THE DRAWINGS

The above and other aspects, features and advantages of certain embodiments of the present disclosure will be more apparent from the following detailed description, taken in conjunction with the accompanying drawings.

DETAILED DESCRIPTION

Hereinafter, various example embodiments of the disclosure will be described in greater detail with reference to accompanying drawings.

The following description with reference to the accompanying drawings is provided to assist in understanding of various example embodiments of the disclosure. It includes various example details to assist in that understanding but these are to be regarded as merely examples. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used to enable a clear and consistent understanding of the disclosure. Accordingly, it should be apparent to those skilled in the art that the following description of various example embodiments of the disclosure is provided for illustration purpose only and not for the purpose of limiting the disclosure.

It is to be understood that the singular forms "a," "an," and "the" include plural referents unless the context clearly dictates otherwise. Thus, for example, reference to "a component surface" includes reference to one or more of such surfaces.

Figure 1:
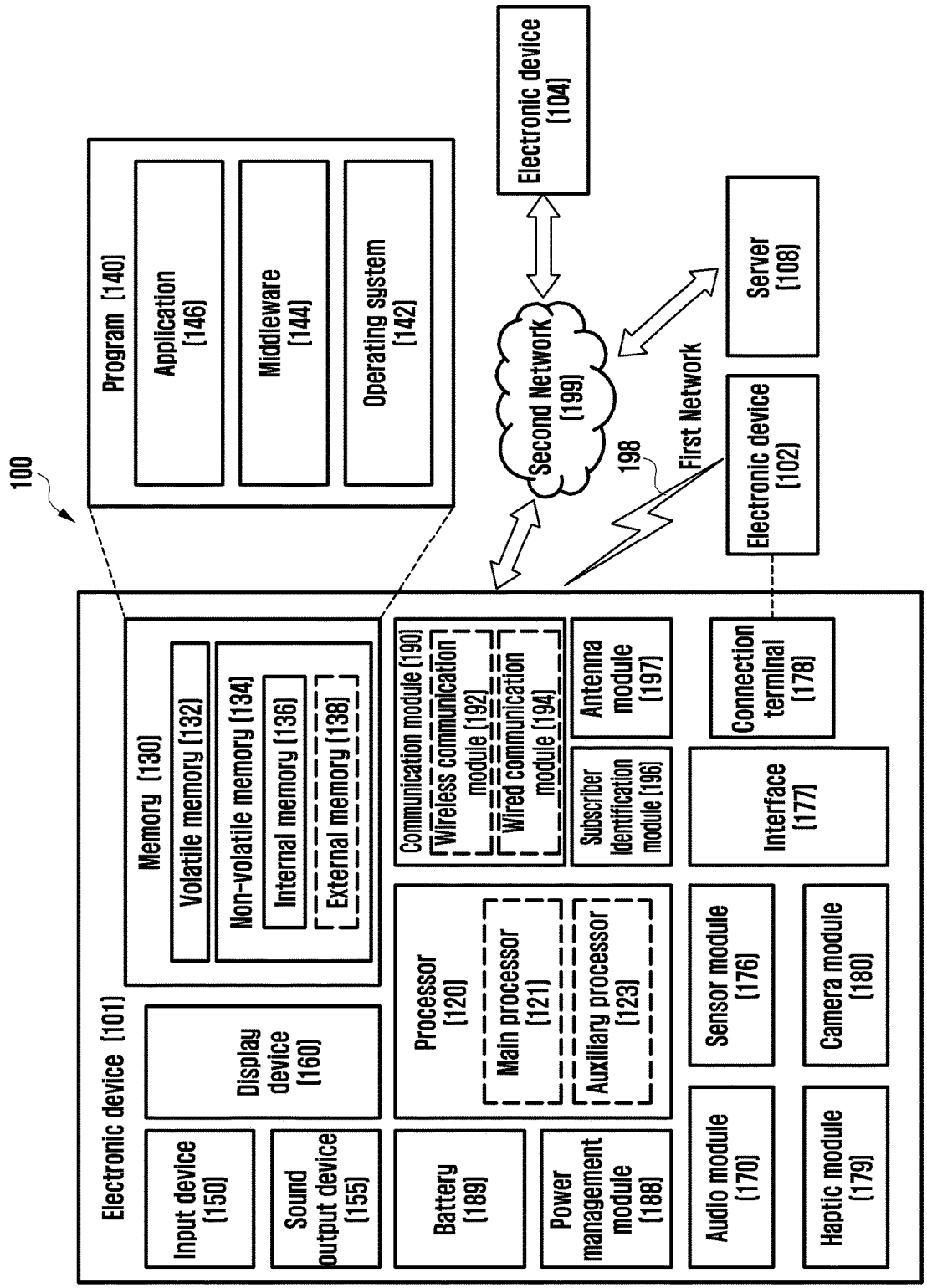
FIG. 1 is a block diagram illustrating an example electronic device in a network environment according to various embodiments of the disclosure.

FIG. 1 is a block diagram illustrating an example electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include, for example, a portable communication device (e.g., a smart phone), a computer device, a portable multimedia device, a portable medical device, a camera, a wearable device, a home appliance, or the like. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

The term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
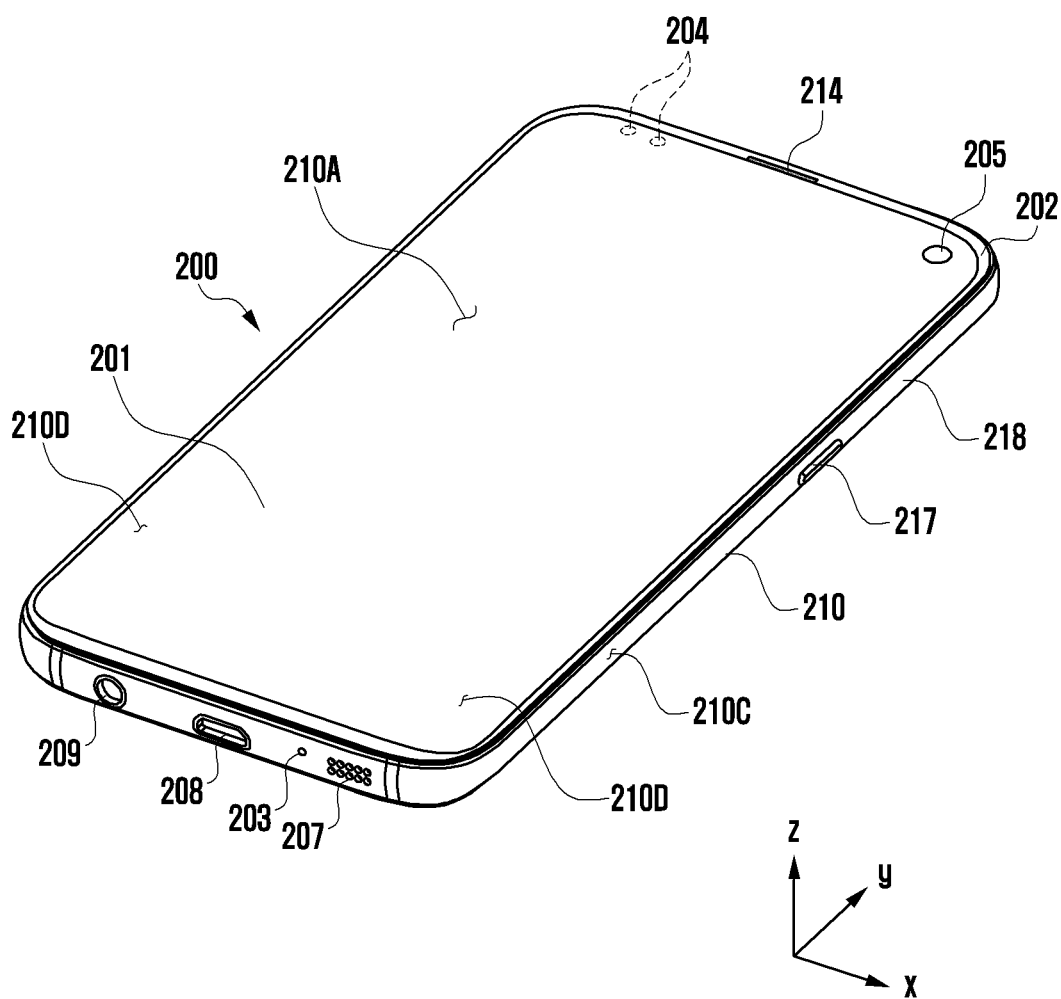
FIG. 2A is a front perspective view illustrating an example mobile electronic device according to various embodiments of the disclosure.
Figure 2B:
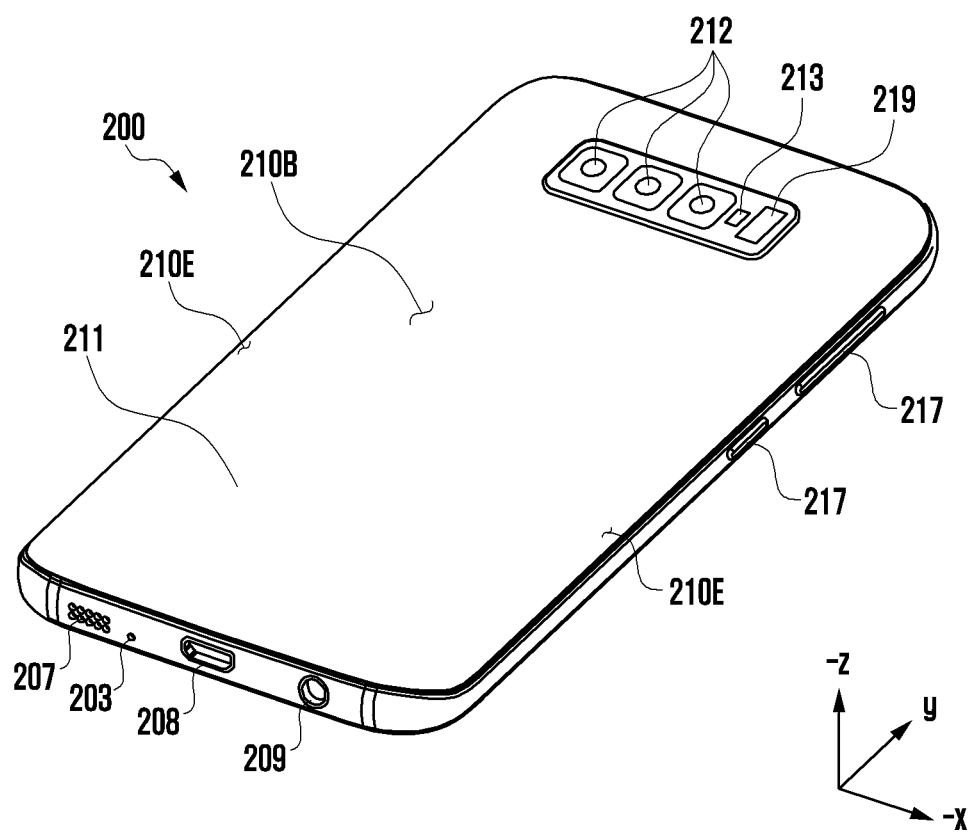
FIG. 2B is a rear perspective view illustrating an example mobile electronic device according to various embodiments of the disclosure.

FIG. 2A is a front a perspective view illustrating an example mobile electronic device 200 according to an embodiment, and FIG. 2B is a rear perspective view illustrating the mobile electronic device 200 shown in FIG. 2A.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, audio modules 203, 207 and 214, sensor modules 204 and 219, camera modules 205, 212 and 213, a key input device 217, a light emitting device, and connector holes 208 and 209. The mobile electronic device 200 may omit at least one (e.g., the key input device 217 or the light emitting device) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. Outlines (i.e., edges and corners) of the display 201 may have substantially the same form as those of the front plate 202. The spacing between the outline of the display 201 and the outline of the front plate 202 may be substantially unchanged in order to enlarge the exposed area of the display 201.

A recess or opening may be formed in a portion of a display area of the display 201 to accommodate at least one of the audio module 214, the sensor module 204, the camera module 205, and the light emitting device. At least one of the audio module 214, the sensor module 204, the camera module 205, the fingerprint sensor (not shown), and the light emitting element may be disposed on the back of the display area of the display 201. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The audio modules 203, 207 and 214 may correspond to a microphone hole 203 and speaker holes 207 and 214, respectively. The microphone hole 203 may contain a microphone disposed therein for acquiring external sounds and, in a case, contain a plurality of microphones to sense a sound direction. The speaker holes 207 and 214 may be classified into an external speaker hole 207 and a call receiver hole 214. The microphone hole 203 and the speaker holes 207 and 214 may be implemented as a single hole, or a speaker (e.g., a piezo speaker) may be provided without the speaker holes 207 and 214.

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device 205 disposed on the first surface 210A of the electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201. The key input device 217 may include the sensor module disposed on the second surface 210B of the housing 210.

The light emitting device may be disposed on the first surface 210A of the housing 210. For example, the light emitting device may provide status information of the electronic device 200 in an optical form. The light emitting device may provide a light source associated with the operation of the camera module 205. The light emitting device may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some sensor modules 205 of camera modules 205 and 212, some sensor modules 204 of sensor modules 204 and 219, or an indicator may be arranged to be exposed through a display 201. For example, the camera module 205, the sensor module 204, or the indicator may be arranged in the internal space of an electronic device 200 so as to be brought into contact with an external environment through an opening of the display 201, which is perforated up to a front plate 202. In another embodiment, some sensor modules 204 may be arranged to perform their functions without being visually exposed through the front plate 202 in the internal space of the electronic device. For example, in this case, an area of the display 201 facing the sensor module may not require a perforated opening.

Figure 3:
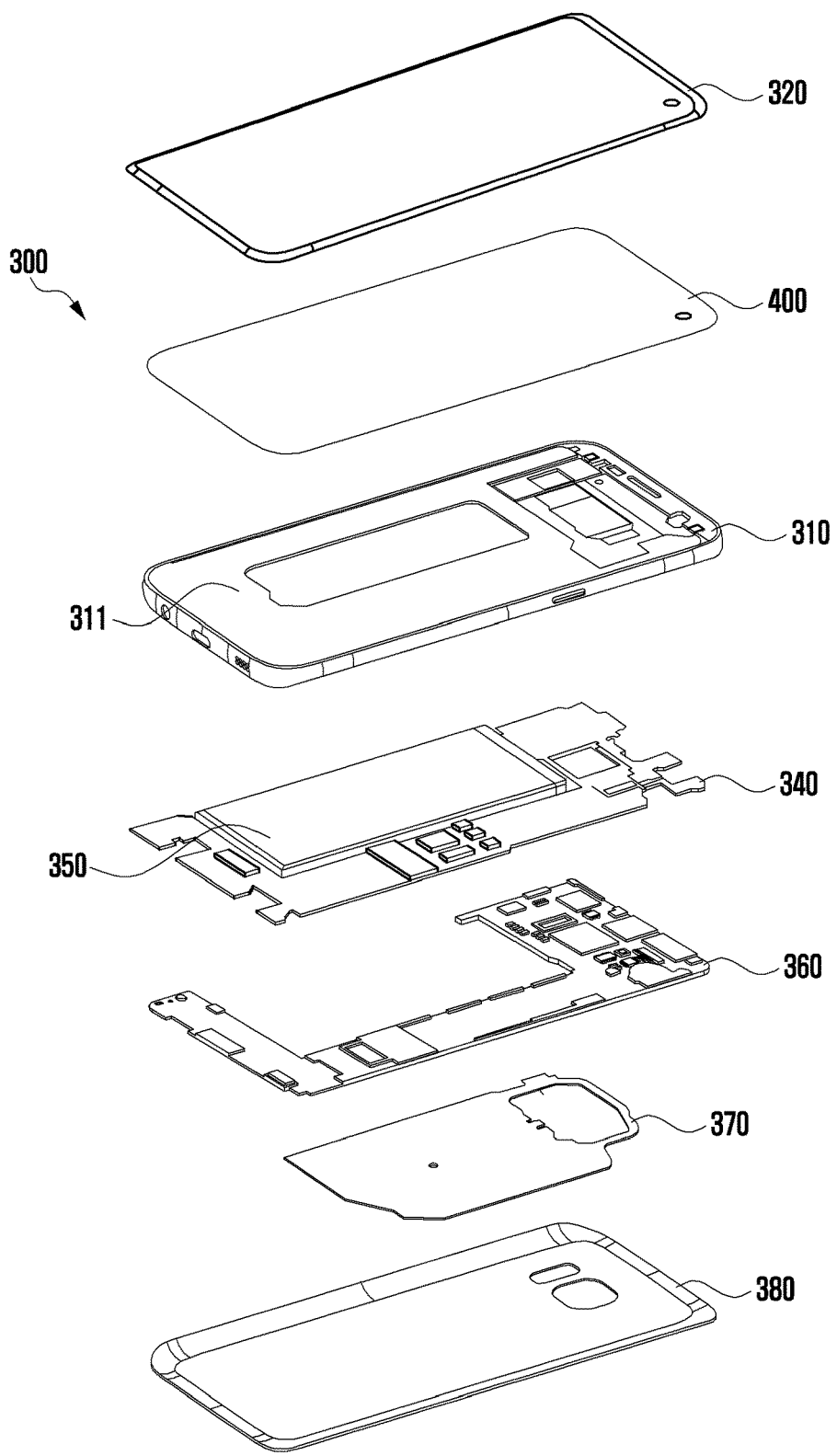
FIG. 3 is an exploded perspective view illustrating an example mobile electronic device according to various embodiments of the disclosure.

FIG. 3 is an exploded perspective view illustrating the example mobile electronic device 300 shown in FIG. 2A.

Referring to FIG. 3, the mobile electronic device 300 may include a lateral bezel structure 310, a first support member 311 (e.g., a bracket), a front plate 320, a display 400, an electromagnetic induction panel, a PCB 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 300 shown in FIG. 2A or FIG. 2B, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 400 at one side thereof and also combined with the PCB 340 at the other side thereof. On the PCB 340, a processor, a memory, and/or an interface may be mounted. The processor may include, for example, one or more of a CPU, an AP, a GPU, an ISP, a sensor hub processor, or a CP.

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
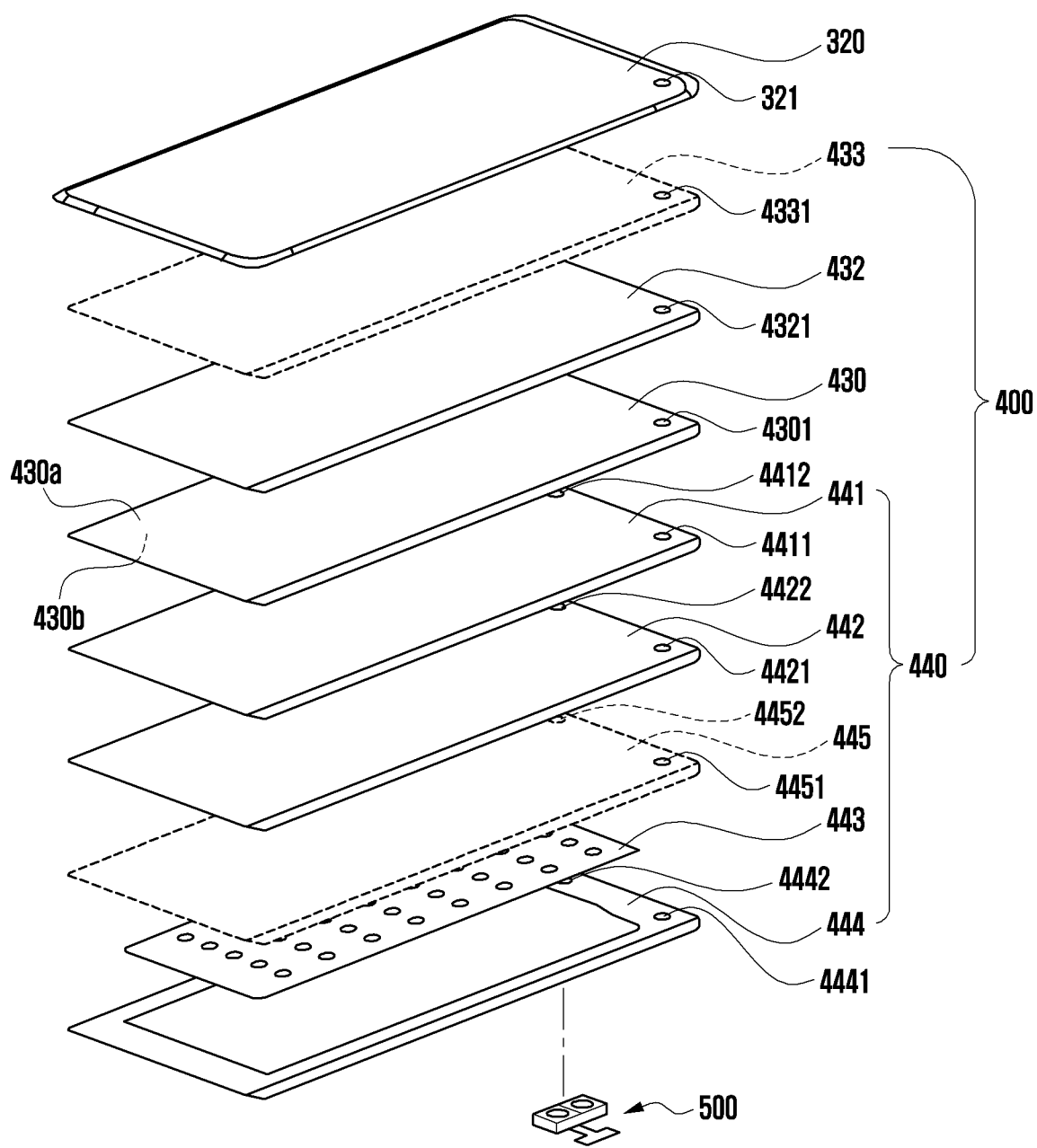
FIG. 4 is an exploded perspective view illustrating an example display according to various embodiments of the disclosure.

FIG. 4 is an exploded perspective view illustrating an example display 400 according to various embodiments of the disclosure.

The display 400 shown in FIG. 4 may be similar, at least in part, to the display 201 shown in FIG. 2A, or may include other embodiments of the display.

Referring to FIG. 4, the display 400 may include a display panel 430 including a polarizer (POL) 432 (e.g., a polarizing film) disposed through an adhesive member on a rear surface of a front cover 320 (e.g., a front plate, a glass plate, or a cover member), and at least one additional layer 440 attached to a rear surface 430b of the display panel 430. According to an embodiment, the POL 432 may be attached to a front surface 430a of the display panel 430. According to an embodiment, the adhesive member may include, for example, and without limitation, an optical clear adhesive (OCA), a pressure sensitive adhesive (PSA), a heat-reactive adhesive, a normal adhesive, a double-sided tape, or the like.

According to various embodiments, the front cover 320 may have a camera-exposed portion 321 disposed at a position corresponding to a camera module (e.g., the camera module 205 in FIG. 2A). According to an embodiment, the camera-exposed portion 321 may be determined depending on a printed region (e.g., a black matrix (BM) area) disposed to surround the camera-exposed portion 321. According to an embodiment, the size or shape of the printed region may be determined depending on the angle of view of the camera module 205. In another embodiment, the front cover 320 may have only the camera-exposed portion 321 without the printed region.

According to various embodiments, the display panel 430 and the POL 432 may be integrally formed. According to an embodiment, the display 400 may further include a touch panel 433. According to an embodiment, the display 400 may operate, for example, and without limitation, as a touch display of in-cell or on-cell type, etc. depending on the arrangement position of the touch panel 433. In another embodiment, the display 400 may also include a fingerprint sensor (not shown) operating through the display panel 430. According to an embodiment, the fingerprint sensor may include, for example, and without limitation, an ultrasonic or optical fingerprint sensor, or the like, capable of recognizing, through a hole formed at least partially in some of components of the display 400, a fingerprint of a finger that is in contact with or close to the outer surface of the front cover 320.

According to various embodiments, the at least one additional layer 440 may include one or more polymer members 441 and 442 disposed on the rear surface of the display panel 430, at least one functional member 443 disposed on a rear surface of the polymer members 441 and 442, and a conductive member 444 disposed on a rear surface of the at least one functional member 443. According to an embodiment, the one or more polymer members 441 and 442 may include an embossing layer 441 for removing air bubbles that may occur between the display panel 430 and underlying layers, and/or a cushion layer 442 for relieving a shock. According to an embodiment, the at least one functional member 443 may include, for example, and without limitation, a graphite sheet for heat dissipation, an added display, a force-touch FPCB, a fingerprint sensor FPCB, a communication antenna radiator, a heat dissipation sheet, a conductive/non-conductive tape, and/or an open cell sponge, or the like. According to an embodiment, the conductive member 444 may be a metal plate used for reinforcing the rigidity of an electronic device (e.g., the electronic device 300 in FIG. 3), shielding ambient noise, and dissipating heat released from surrounding components. In an embodiment, the conductive member 444 may include, for example, and without limitation, copper (Cu), aluminum (Al), stainless steel (SUS), a clad (e.g., a laminated stack of different kinds of metals such as SUS and Al), or the like. In another embodiment, the display 400 may further include a detection member 445 for detecting an input action by a writing member (e.g., an electronic pen) of electromagnetic induction type. According to an embodiment, the detection member 445 may include a digitizer. According to an embodiment, the detection member 445 may be disposed between the lower polymer member 442 and the functional member 443. In another embodiment, the detection member 445 may be disposed between the display panel 430 and the upper polymer member 441.

According to various embodiments, the front cover 320 may have the camera-exposed portion 321 that is formed at a position at least partially overlapping the display panel 430 when the front cover 320 is viewed from above. According to an embodiment, the display panel 430 may have an opening 4301 formed at a position overlapping with the camera-exposed portion 321 when the front cover 320 is viewed from above. According to an embodiment, the POL 432 and/or the touch panel 433 attached to the display panel 430 may also have openings 4321 and 4331 formed at corresponding positions. According to an embodiment, when the front cover 320 is viewed from above, the at least one additional layer 440 may also include openings 4411, 4421, 4441, and 4451 formed at positions corresponding to the openings 4301.

The electronic device (e.g., the electronic device 300 in FIG. 3) according to embodiments may include an optical sensor module 500 disposed by being attached to a rear surface of the display 400. According to an embodiment, the optical sensor module 500 may include various kinds of sensor modules that detect external environments by detecting light emitted through the display 400 and then reflected on external objects. According to an embodiment, the optical sensor module 500 may include, for example, and without limitation, at least one of a camera module (e.g., including a camera), an ultraviolet (UV) sensor module, an iris sensor module, a spectroscopic sensor module, an infrared (IR) sensor module, a red-green-blue (RGB) sensor module, and/or a time-of-flight (TOF) sensor module, or the like, each of the various sensor modules including corresponding sensing circuitry.

According to various embodiments, the optical sensor module 500 is capable of emitting and receiving light. However, the additional layer 440 does not allow the penetration of light. Therefore, in order to allow the transmission of light emitted from or reflected toward the optical sensor module 500, the additional layer 400 may have one or more through-holes 4412, 4422, 4442, and 4452 formed at a position corresponding to the underlying optical sensor module 500. In another embodiment, when the optical sensor module 500 is the camera sensor module or the TOF module, the display panel 430 and the POL 432 may also have through-holes (not shown) formed at corresponding positions.

Figure 5A:
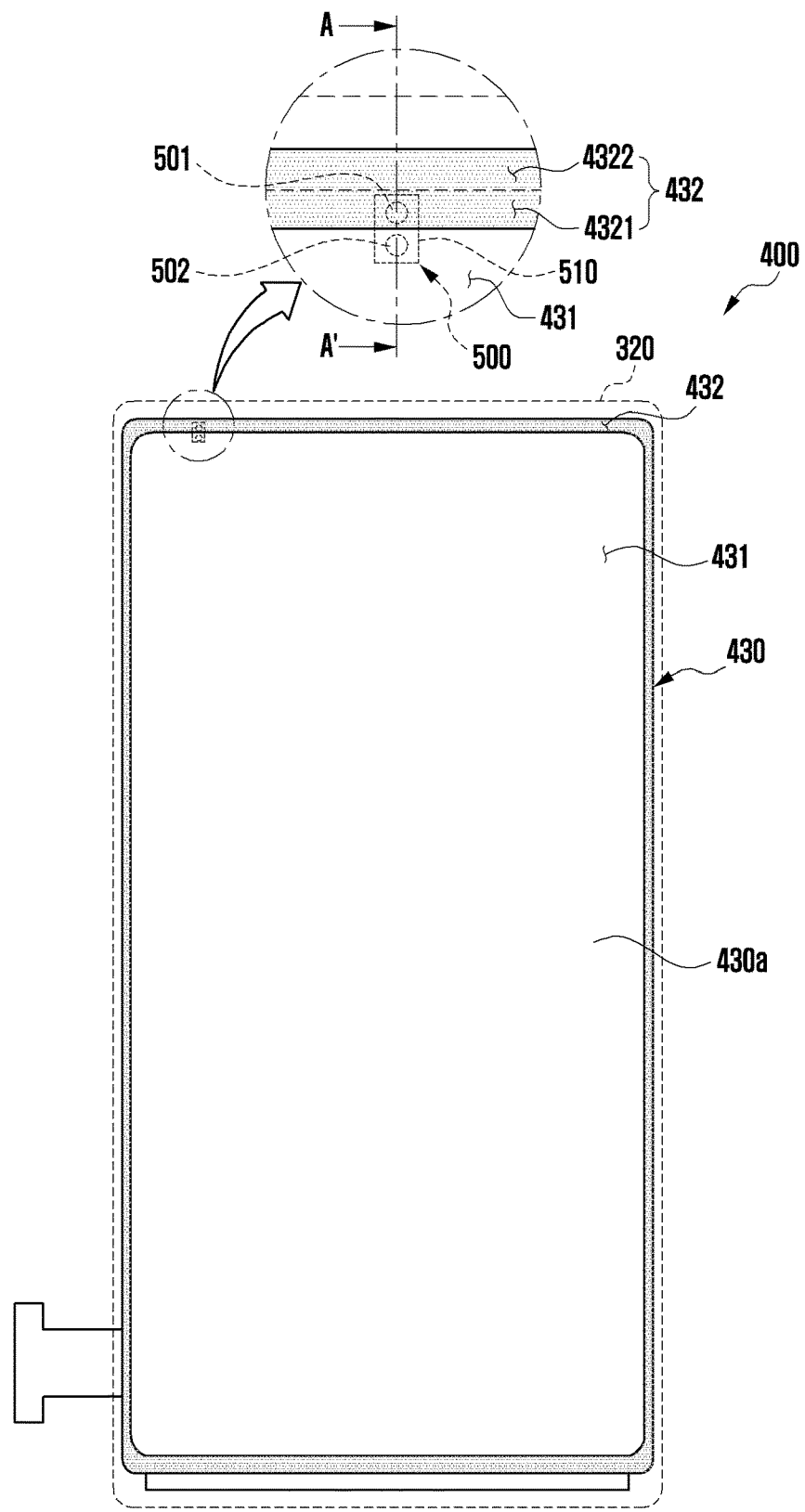
FIG. 5A is a diagram illustrating a front surface of an example display according to various embodiments of the disclosure.
Figure 5B:
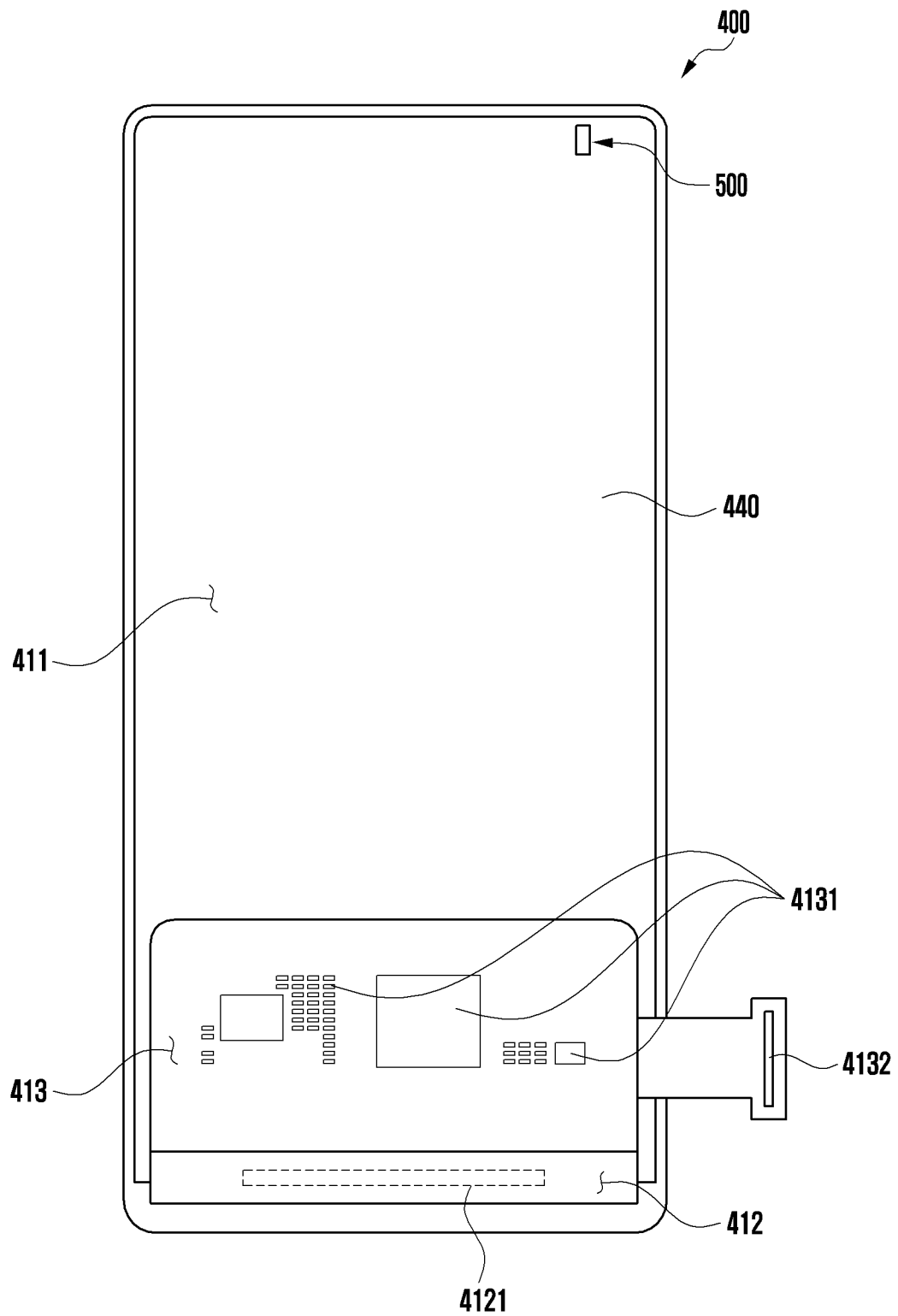
FIG. 5B is a diagram illustrating a rear surface of an example display according to various embodiments of the disclosure.

FIG. 5A is a diagram illustrating a front surface of an example display 400 according to various embodiments of the disclosure. FIG. 5B is a diagram illustrating a rear surface of the example display 400 according to various embodiments of the disclosure.

Referring to FIGS. 5A and 5B, the display 400 may be attached to the rear surface of the front cover 320 through the adhesive member as described above. According to an embodiment, the display 400 may include the display panel 430 and the additional layer 440 attached to the rear surface 430b of the display panel 430. According to an embodiment, the display panel 430 may have the front surface 430a (e.g., the first surface) facing the front cover 320, and the rear surface 430b (e.g., the second surface) opposite to the front surface 430a and allowing the additional layer 440 to be attached.

According to various embodiments, as shown in FIG. 5B, the display 400 may include a flat portion 411, a bendable portion 412 folded from the flat portion 411 to the rear surface of the display 400, and a flexible printed circuit board (FPCB) 413 electrically connected to the bendable portion 412. According to an embodiment, the display 400 may include a control circuit 4121 mounted on the bendable portion 412. According to an embodiment, the control circuit 4121 may include, for example, a display driver IC (DDI) or a touch display driver IC (TDDI) mounted on the bendable portion 412. According to an embodiment, the DDI or TDDI may be mounted on the bendable portion 412 in, for example, a chip-on-panel (COP) structure. According to an embodiment, at least a part of the FPCB 413 and the bendable portion 412 may be folded to the rear surface of the display 400 and attached to the additional layer 440 through bonding or taping. According to an embodiment, the display 400 may include a plurality of elements 4131 disposed on the FPCB 413, and an electronic connector 4132 electrically connected to a printed circuit board (e.g., the PCB 340 in FIG. 3) of an electronic device (e.g., the electronic device 300 in FIG. 3). According to an embodiment, the plurality of elements 4131 may include, for example, and without limitation, a touch IC, a flash memory for display, an ESD protection diode, a decoupling capacitor, or the like.

According to various embodiments, as shown in FIG. 5A, the display panel 430 may include a display area 431 (e.g., an active area), which substantially occupies most area, and a non-display area 432 (e.g., an inactive area or a black matrix (BM) area) disposed to surround at least in part the periphery of the display area 431 and having a certain width. According to an embodiment, the non-display area 432 may include a first non-display area 4321 disposed to surround at least in part the periphery of the display area 431, and a second non-display area 4322 disposed to surround at least in part the periphery of the first non-display area 4321. According to an embodiment, the first non-display area 4321 may have a greater transmittance than the display area 431.

According to various embodiments, the display 400 may include the optical sensor module 500 that is disposed at a suitable place on the rear surface of the additional layer 440 (e.g., the conductive member). According to an embodiment, the optical sensor module 500 may include a flexible printed circuit board (FPCB) (e.g., the FPCB 520 in FIG. 7), a module housing 510 mounted on the FPCB 520, a light emitting structure (e.g., including light emitting circuitry) 501 disposed in the module housing 510, and a light receiving structure (e.g., including light receiving circuitry) 502 disposed in the module housing 510 to be spaced apart from the light emitting structure 501. According to an embodiment, when the display 400 is viewed from above, the optical sensor module 500 may be disposed such that the light emitting structure 501 overlaps the first non-display area 4321 and the light receiving structure 502 overlaps the display area 431. When the light emitting structure 501 is disposed within the first non-display area 4321 having a relatively high transmittance to avoid the display area 431, the degradation of sensing performance due to diffused reflection can be prevented and/or reduced. In addition, a spot phenomenon that may occur in the display area 431 by light emitted from the light emitting structure 501 and leaking to the display device may be prevented and/or reduced.

Figure 6:
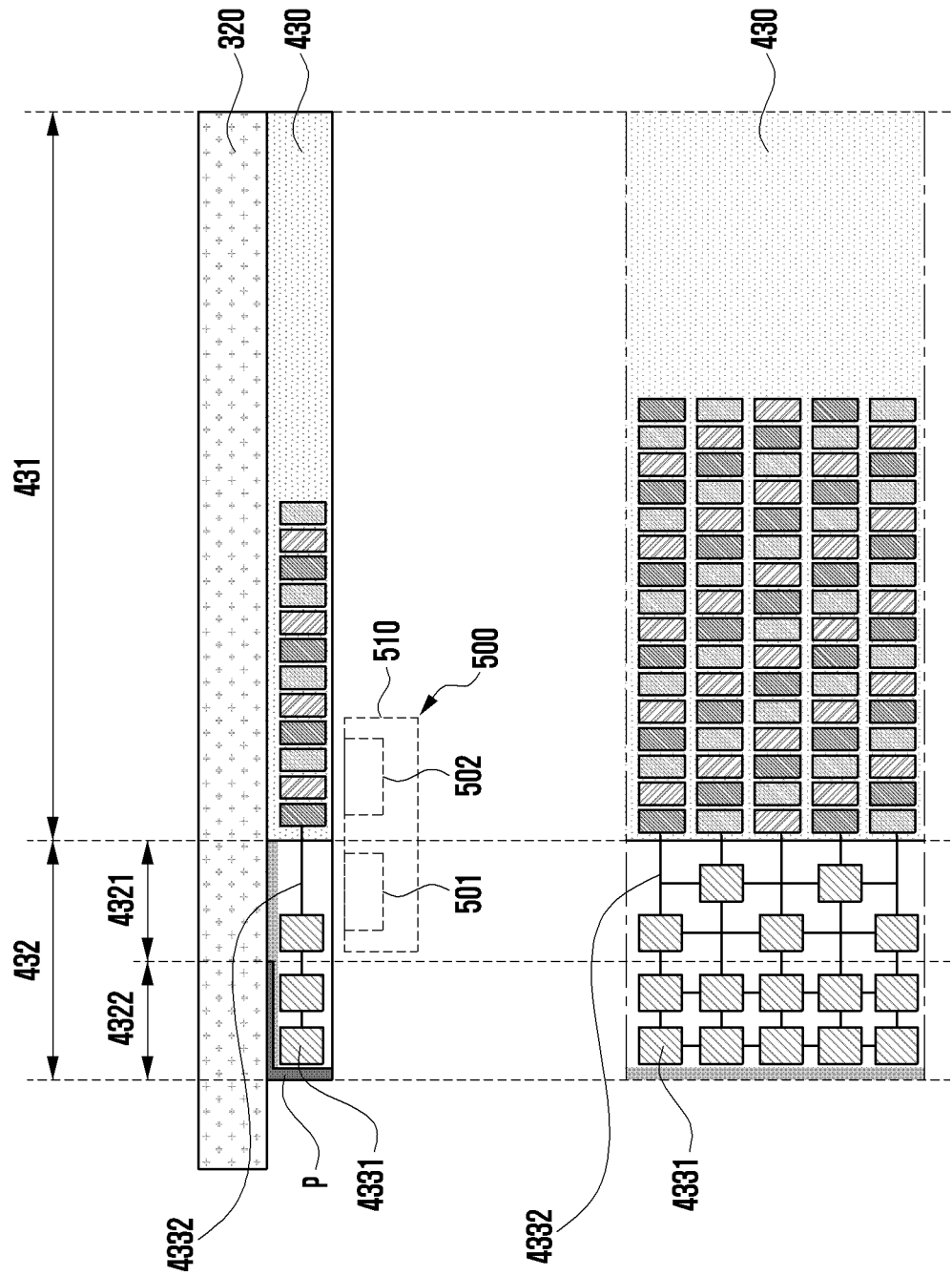
FIG. 6 is a combination of a cross-sectional view and a plan view illustrating an arrangement relationship between a display panel and an optical sensor module according to various embodiments of the disclosure.

FIG. 6 is a combination of a cross-sectional view and a plan view illustrating an arrangement relationship between a display panel 430 and an optical sensor module 500 according to various embodiments of the disclosure. The cross-section view of FIG. 6 is taken along the line A-A' of FIG. 5A.

Referring to FIG. 6, the display panel 430 disposed on the rear surface of the front cover 320 may include the display area 431 having a first transmittance and the non-display area 432 disposed adjacent to the display area 431. According to an embodiment, the non-display area 432 may include the first non-display area 4321 adjacent to the display area 431 and having a second transmittance greater than the first transmittance, and the second non-display area 4322 adjacent to the first non-display area 4321 and having a transmittance of 0%. According to an embodiment, the second non-display area 4322 may have a printed layer P formed on the outer surface thereof. According to an embodiment, the first transmittance may range, for example, from about 1% to about 4%. According to an embodiment, the second transmittance may range, for example, from about 5% to about 10%.

According to various embodiments, the display area 431 of the display panel 430 may contain a plurality of pixels. According to an embodiment, the non-display area 432 may contain driving circuits 4331 (e.g., gate driving circuits) disposed to control the plurality of pixels, and wiring structures 4332 electrically connecting the driving circuits 4331. According to an embodiment, the second transmittance of the first non-display area 4321 may be determined by adjusting the arrangement density of the driving circuits 4331 and the wiring structures 4332. For example, the second transmittance of the first non-display area 4321 may be determined depending on the arrangement density of the driving circuits 4331 and the wiring structures 4332 arranged in the first non-display area 4321 to be lower than the arrangement density of the driving circuits 4331 and wiring structures 4332 arranged in the second non-display region 4322.

According to various embodiments, when the display panel 430 is viewed from above, the optical sensor module 500 may be disposed such that the light emitting structure 501 overlaps the first non-display area 4321 and the light receiving structure 502 overlaps the display area 431. With this arrangement, the light emitting structure 501 can emit light through the first non-display area 4321 having the relatively high second transmittance, and the light receiving structure 502 disposed under the display area 431 can smoothly receive light reflected from the outside.

Figure 7:
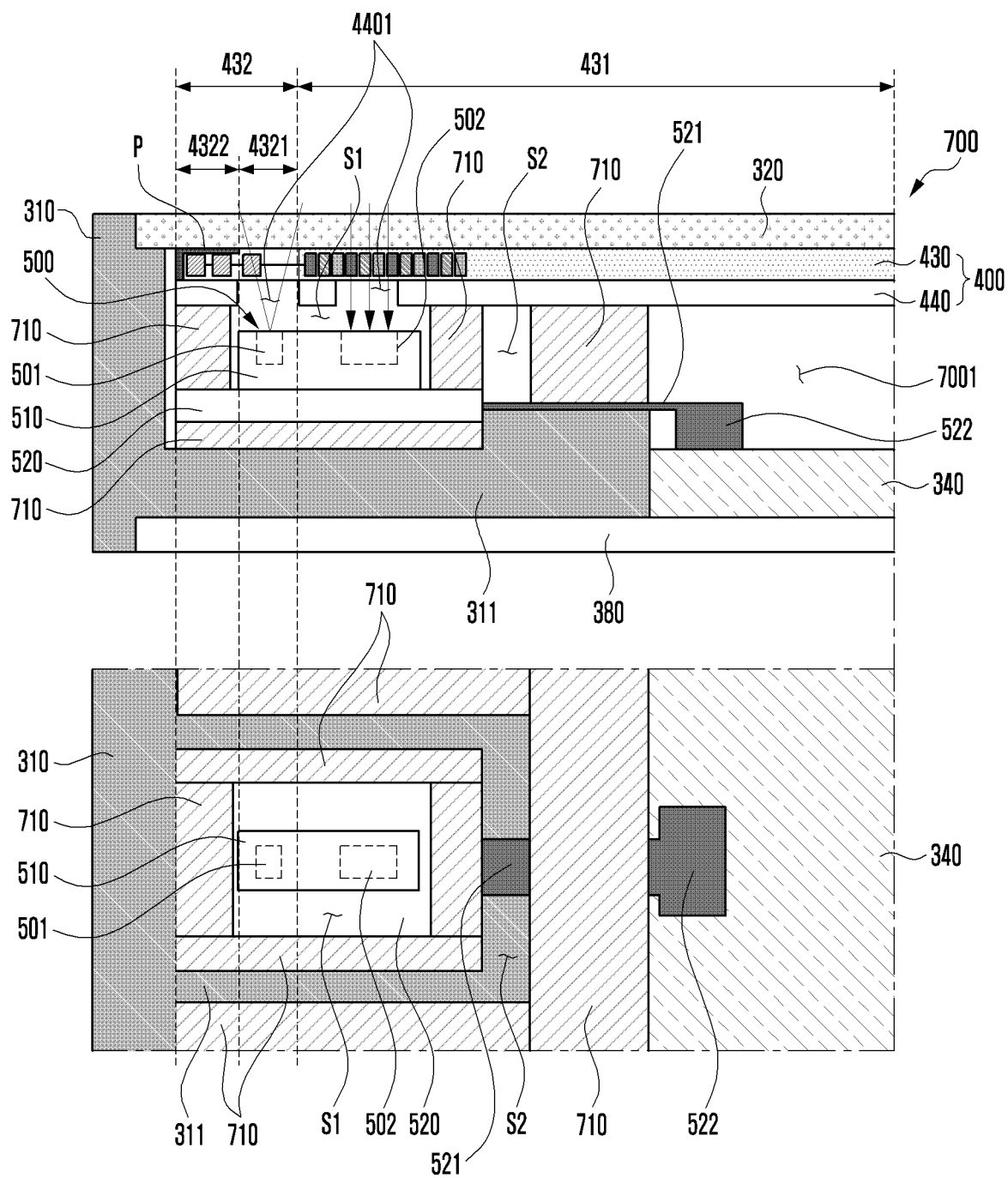
FIG. 7 is a combination of a cross-sectional view and a plan view partially illustrating an electronic device including an optical sensor module according to various embodiments of the disclosure.

FIG. 7 is a combination of a cross-sectional view and a plan view partially illustrating an example electronic device 700 including an optical sensor module 500 according to various embodiments of the disclosure.

The electronic device 700 shown in FIG. 7 may be similar, at least in part, to the electronic device 101 of FIG. 1, the electronic device 200 of FIGS. 2A and 2B, or the electronic device 300 of FIG. 3, or may include other embodiments of the electronic device.

Referring to FIG. 7, the electronic device 700 may include a housing structure (e.g., the housing 210 in FIG. 2A) including a front cover 320 (e.g., a cover member, a front plate, a front window, or a first plate), a rear cover 380 (e.g., a rear cover member, a rear plate, a back window, or a second plate) facing in a direction opposite to the front cover 320, and a lateral member 310 surrounding an inner space 7001 between the front cover 320 and the rear cover 380. According to an embodiment, the lateral member 310 may include a support member 311 that extends at least partially into the inner space 7001 of the electronic device 700. According to an embodiment, the support member 311 may be formed by structural coupling with the lateral member 310. According to an embodiment, the support member 311 may have a structural shape for supporting at least a part of the optical sensor module 500 disposed under the additional layer 440 of the display 400.

According to various embodiments, the electronic device 700 may include the display 400 disposed in the inner space 7001 to be visible from the outside through at least a portion of the front cover 320. According to an embodiment, the display 400 may include the display panel 430 attached to the front cover 320, and the additional layer 440 attached to the rear surface of the display panel 430. According to an embodiment, the display panel 430 may include the display area 431 having the first transmittance, the first non-display area 4321 adjacent to the display area 431 and having the second transmittance greater than the first transmittance, and the second non-display area 4322 adjacent to the first non-display area 4321.

According to various embodiments, the electronic device 700 may include the optical sensor module 500 disposed in the inner space 7001 and attached to the additional layer 440 of the display 400. According to an embodiment, when the display panel 430 is viewed from above, the optical sensor module 500 may be disposed such that the light emitting structure 501 overlaps the first non-display area 4321 and the light receiving structure 502 overlaps the display area 431. According to an embodiment, because the additional layer 440 does not allow the transmission of light, the additional layer 440 may have at least one through-hole 4401 formed up to the display panel 430 at a position facing the light emitting structure 501 and the light receiving structure 502. According to an embodiment, the at least one through-hole 4401 may be formed at each of a position corresponding to the light emitting structure 501 and a position corresponding to the light receiving structure 502. In another embodiment, the at least one through-hole 4401 may be formed as a single hole to correspond to both the light emitting structure 501 and the light receiving structure 502.

According to various embodiments, the optical sensor module 500 may include the FPCB 520 and the module housing 510 mounted on the FPCB 520, and also include the light emitting structure 501 and the light receiving structure 502 both of which are disposed in the module housing 510, spaced apart from each other, and electrically connected to the FPCB 520. According to an embodiment, the optical sensor module 500 may further include an extension 521 extending from the FPCB 520, and an electrical connector 522 mounted at the end of the extension 521. According to an embodiment, the electrical connector 522 may be electrically connected to the PCB 340 (e.g., a main PCB) that is separately disposed in the inner space 7001 of the electronic device 700.

According to various embodiments, the optical sensor module 500 may be disposed in a manner that the FPCB 520 is attached to the additional layer 440 of the display 400 through at least one waterproof member 710 (e.g., a waterproof tape). According to an embodiment, the optical sensor module 500 may have a first sealing structure (S1) for sealing the module housing 510 through the at least one waterproof member 710 disposed between the additional layer 440 and the FPCB 520. For example, the at least one waterproof member 710 is disposed on the FPCB 520 to surround the module housing 510 and then attached to the additional layer 440, so that the optical sensor module 500 can be disposed under the display 400. According to an embodiment, the optical sensor module 500 may also have a second sealing structure (S2) for sealing even the FPCB 520 through at least one waterproof member 710 disposed between the additional layer 440 and the support member 311. According to an embodiment, because the optical sensor module 500 is attached to the rear surface of the additional layer 440 of the display 400 through the first sealing structure S1 and the second sealing structure S2, it is possible to prevent and/or reduce foreign matter and/or moisture from entering the through-hole 4401 formed in the additional layer 440. According to an embodiment, when the display 400 is disposed through the lateral member 310 and the support member 311 of the electronic device 700, the FPCB 520 may be attached to the support member 311 through the waterproof member 710 (e.g., a double-sided tape).

As such, the optical sensor module 500 according to embodiments of the disclosure is directly arranged under the display 400 using the FPCB 520 provided separately from the PCB 340. This arrangement can prevent and/or reduce sensing errors due to tilt tolerances (e.g., a tilt of the optical sensor module) and also allow an efficient layout design in which the optical sensor module 500 is disposed up to the uppermost portion (in a plan view) of the display 400 separately from the PCB 340.

Figure 8:
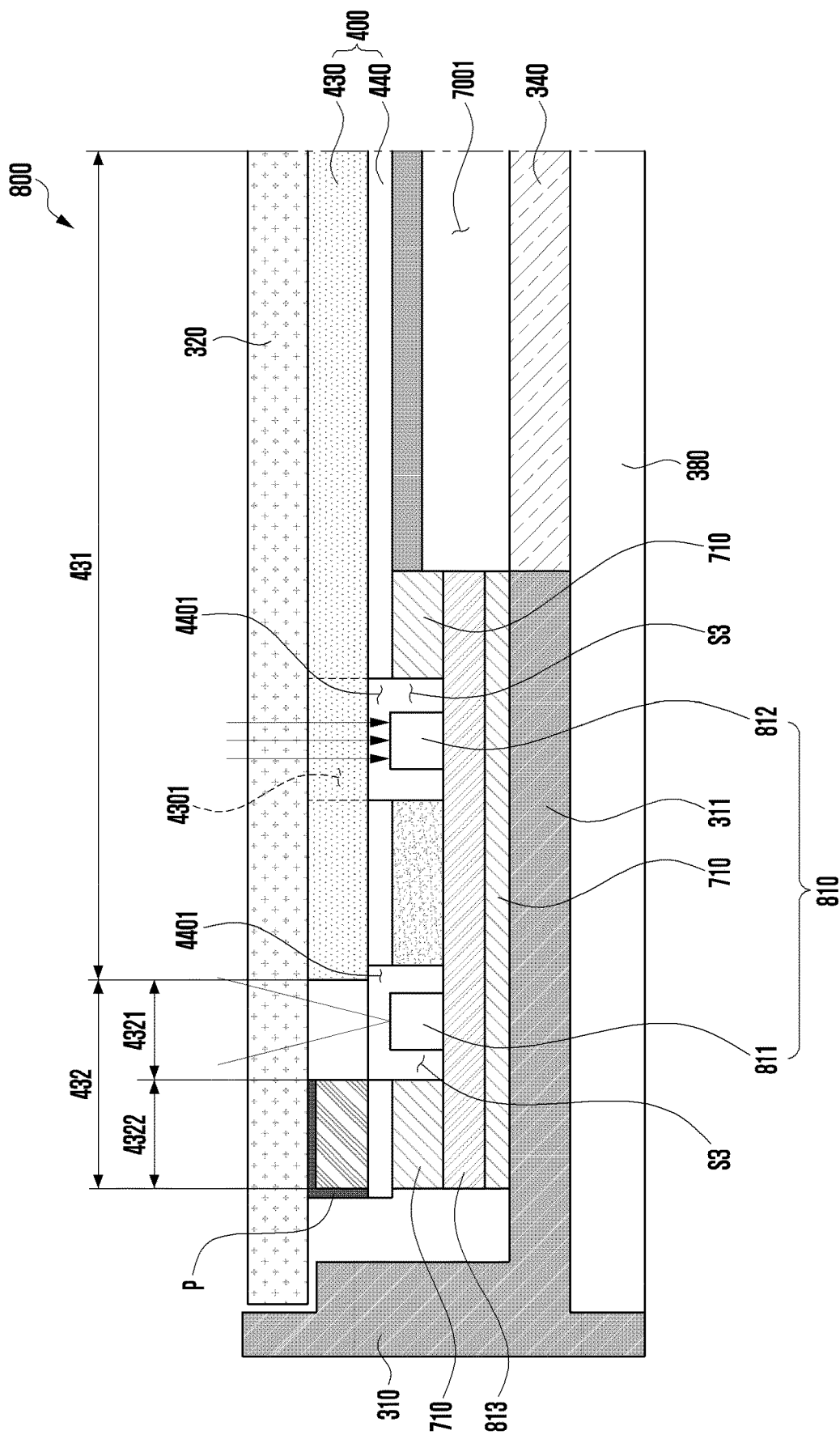
FIG. 8 is a cross-sectional view partially illustrating an example electronic device including a distance detection sensor module according to various embodiments of the disclosure.

FIG. 8 is a cross-sectional view partially illustrating an example electronic device 800 including a distance detection sensor module 810 according to various embodiments of the disclosure.

The electronic device 800 shown in FIG. 8 may be similar, at least in part, to the electronic device 101 of FIG. 1, the electronic device 200 of FIGS. 2A and 2B, the electronic device 300 of FIG. 3, or the electronic device 700 of FIG. 7, or may include other embodiments of the electronic device.

In describing FIG. 8, the substantially same components as those of FIG. 7 are denoted by the same reference numerals, and detailed descriptions thereof may not be repeated here.

Referring to FIG. 8, the electronic device 800 may include the distance detection sensor module 810 (e.g., a time-of-flight (TOF) module) disposed under the display 400 in the inner space 7001. According to an embodiment, the distance detection sensor module 810 may include a light emitting structure 811 (e.g., a vertical cavity surface emitting laser (VCSEL)) for irradiating a laser light, and a light receiving structure 812 (e.g., an infrared camera) disposed near the light emitting structure 811 and detecting light irradiated from the light emitting structure 811 and then reflected by an external object. For example, the light emitting structure 811 and the light receiving structure 812 may be arranged side by side on one FPCB 813, and may be controlled through a control circuit (e.g., a driver IC) (not shown).

According to various embodiments, the distance detection sensor module 810 may be disposed, when the display 400 is viewed from above, such that the light emitting structure 811 overlaps the first non-display area 4321, and the light receiving structure 812 overlaps the display area 431. According to an embodiment, the light emitting structure 811 and the light receiving structure 812 may be disposed to face the display panel 430 through the through-hole 4401 formed in the additional layer 440. According to an embodiment, in case of the distance detection sensor module 810, a corresponding portion of the display panel 430 overlapping the light receiving structure 812 may have an opening or aperture 4301 perforated for smooth operation of the infrared camera.

According to various embodiments, the distance detection sensor module 810 may also be directly attached to the additional layer 440 underlying the display panel 430 through the waterproof member 710. For example, the distance detection sensor module 810 may be disposed to have a third sealing structure (S3) through the waterproof member 710 surrounding both the light emitting structure 811 and the light receiving structure 812 between the FPCB 813 and the additional layer 440. According to an embodiment, when the display 400 is disposed through the lateral member 310 and/or the support member 311, the FPCB 813 of the distance detection sensor module 810 may be attached to the support member 311 through the waterproof member 710 (e.g., a double-sided tape).

Figure 9:
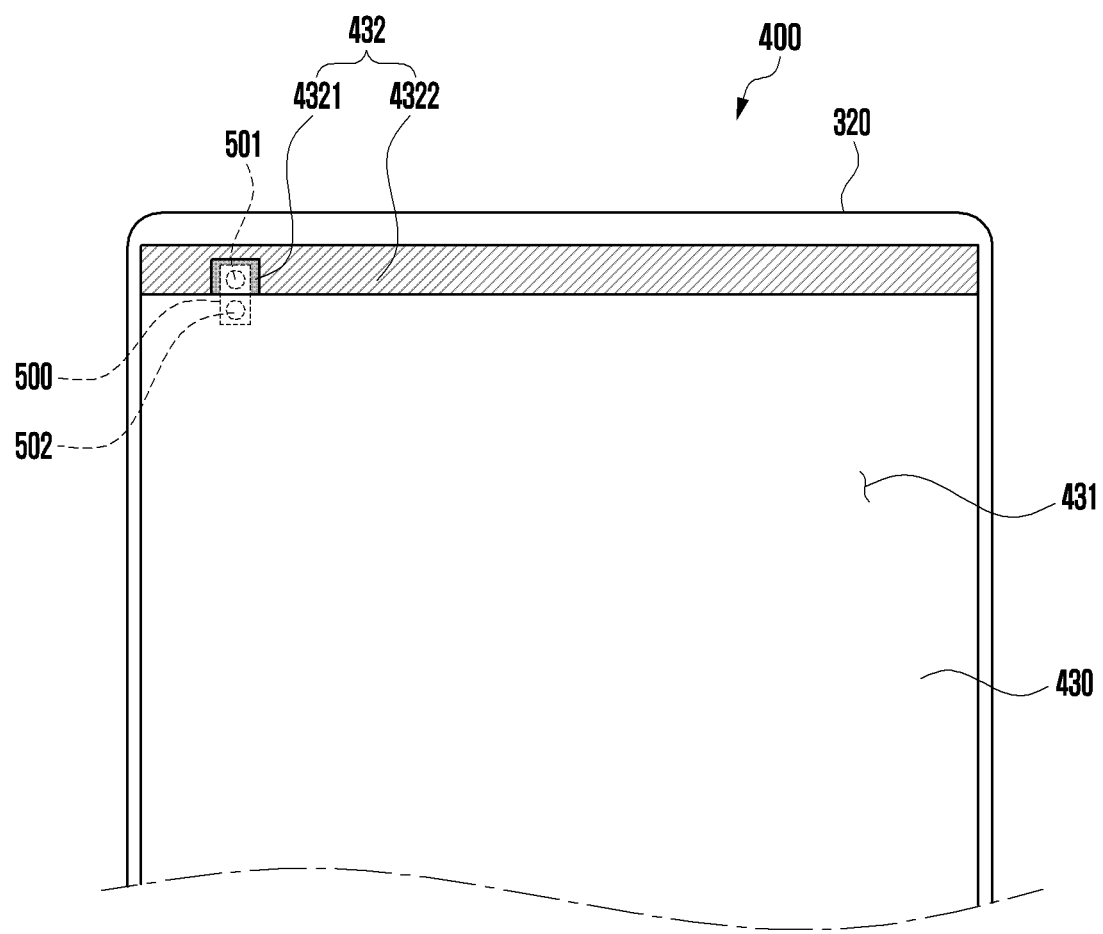
FIG. 9 is a diagram partially illustrating an example display and an optical sensor module according to various embodiments of the disclosure.

FIG. 9 is a diagram illustrating an example display 400 and an optical sensor module 500 according to various embodiments of the disclosure.

Referring to FIG. 9, the display panel 430 attached to the rear surface of the front cover 320 may include the display area 431 having the first transmittance, the first non-display region 4321 disposed adjacent to the display area 431 and having the second transmittance greater than the first transmittance, and the second non-display region 4322 adjacent to the first non-display region 4321 and having a transmittance of about 0%. According to an embodiment, when the display 400 is viewed from above, the optical sensor module 500 may be disposed such that the light emitting structure 501 overlaps the first non-display area 4321 and the light receiving structure 502 overlaps the display area 431.

According to various embodiments, the first non-display area 4321 may occupy only a portion of the non-display area 432 overlapping the light emitting structure 501, and the other portion may be formed as the second non-display area 4322. In this example, because the second non-display area 4322 is expanded relatively, the freedom of layout design for driving circuits (e.g., the driving circuits 4331 in FIG. 6) and wiring structures (e.g., the wiring structures 4332 in FIG. 6) may be increased.

Figure 10:
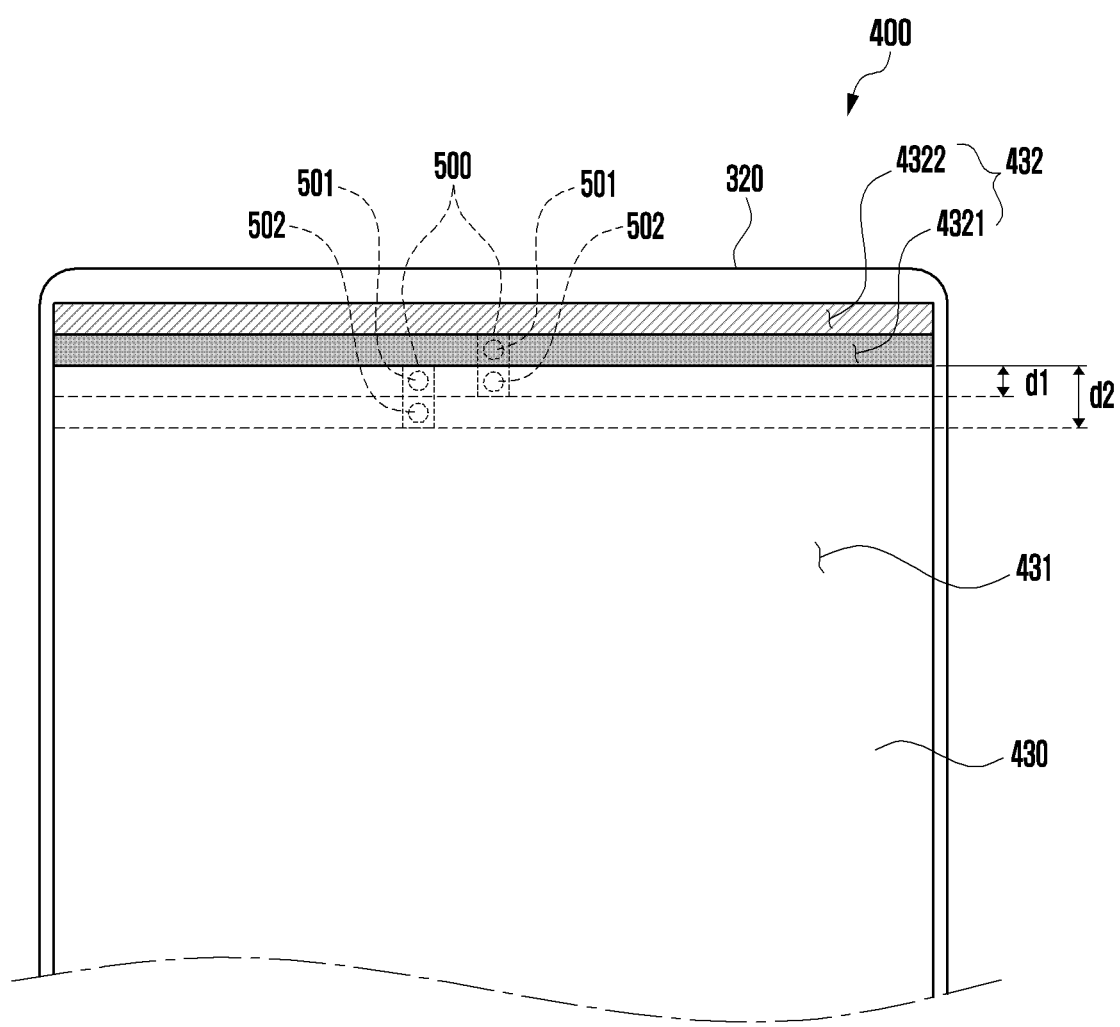
FIG. 10 is a diagram comparing partial-off portions of a display area depending on an arrangement position of an optical sensor module according to various embodiments of the disclosure.

FIG. 10 is a diagram comparing partial-off portions of a display area 431 depending on an arrangement position of an optical sensor module 500 according to various embodiments of the disclosure.

Referring to FIG. 10, a processor (e.g., the processor 120 in FIG. 1) of an electronic device (e.g., the electronic device 101 in FIG. 1) may control at least a portion of the display area 431 for smooth operation of the optical sensor module 500. For example, when the optical sensor module 500 is a proximity sensor module, when the electronic device 101 enters a specific mode (e.g., a face recognition mode, a call reception or transmission mode for a video call) for recognizing an object through the light receiving structure 502, and when light emitted from the light emitting structure 501 is reflected on an external object and then returns to the light receiving structure 502, light of a pixel region controlled to the 'on' state in the display area 431 may cause wrong operations of the light receiving structure 502. Therefore, in such a mode, the processor 120 may control the display to partially turn off a certain portion of the display area 431 overlapping the optical sensor module 500 (especially, the light receiving structure).

In various embodiments where the light emitting structure 501 of the optical sensor module 500 is disposed in the first non-display area 4321, the display area 431 partially turned off has a first width (d1). In a comparative example where both the light emitting structure 501 and the light receiving structure 502 of the optical sensor module 500 are disposed in the display area 431, the display area 431 partially turned off has a second width (d2). Because the first width (d1) is smaller than the second width (d2), this may help in the efficient operation of the display area.

As described above, the electronic device according to various example embodiments of the disclosure has an improved arrangement structure in which the light emitting structure is disposed at a position overlapping a portion of the non-display area formed to have a relatively high transmittance. Through this, it is possible to prevent and/or reduce a spot phenomenon in the display area caused by the photoelectric effect, and also to prevent and/or reduce performance degradation due to interference by relieving diffused reflection. In addition, by directly placing the optical sensor module on the rear surface of the display, it is possible to contribute to improved assembling efficiency and slimness of the electronic device.

According to various example embodiments, an electronic device (e.g., the electronic device 700 in FIG. 7) may include a housing (e.g., the housing 210 in FIG. 2A), a display panel (e.g., the display panel 430 in FIG. 7), and an optical sensor module (e.g., the optical sensor module 500 in FIG. 7). The display panel may be disposed in an inner space (e.g., the inner space 7001 in FIG. 7) of the housing and be visible at least in part from an outside through the housing, and include a display area (e.g., the display area 431 in FIG. 7), a first non-display area (e.g., the first non-display area 4321 in FIG. 7) disposed adjacent to at least a peripheral portion of the display area, and a second non-display area (e.g., the second non-display area 4322 in FIG. 7) disposed adjacent to at least a peripheral portion of the first non-display area. The optical sensor module may be disposed in the inner space to at least partially overlap the display panel, and include a flexible printed circuit board (FPCB) (e.g., the FPCB 520 in FIG. 7), a light emitting structure comprising light emitting circuitry (e.g., the light emitting structure 501 in FIG. 7) disposed on the FPCB and at least partially overlapping the first non-display area when the display panel is viewed from above, and a light receiving structure comprising light receiving circuitry (e.g., the light receiving structure 502 in FIG. 7) disposed on the FPCB and at least partially overlapping the display area when the display panel is viewed from above. The display area may have a first transmittance, and the first non-display area may have a second transmittance greater than the first transmittance.

According to various example embodiments, each of the first non-display area and the second non-display area may include driving circuits (e.g., the driving circuits 4331 in FIG. 6) and wiring structures (e.g., the wiring structures 4332 in FIG. 6) arranged to control pixels disposed in the display area.

According to various example embodiments, the second transmittance may be based on an arrangement density of the driving circuits and the wiring structures.

According to various example embodiments, the first transmittance may be in a range from about 1% to about 4%, and the second transmittance may be in a range from about 5% to about 10%.

According to various example embodiments, the electronic device may further include a printed circuit board (PCB) (e.g., the PCB 340 in FIG. 7) disposed in the inner space, and the FPCB may be electrically connected to the PCB through an electrical connector (e.g., the electrical connector 522 in FIG. 7).

According to various example embodiments, the electronic device may further include at least one additional layer (e.g., the additional layer 440 in FIG. 7) disposed on a rear surface of the display panel and having at least one through-hole (e.g., the through-hole 4401 in FIG. 7) formed therein. In this example, the optical sensor module may be attached to a rear surface of the additional layer such that the light emitting structure and the light receiving structure face the at least one through-hole in the additional layer.

According to various example embodiments, the electronic device may further include at least one waterproof member including a waterproof material (e.g., the waterproof member 710 in FIG. 7) disposed to attach the optical sensor module to the additional layer in the inner space.

According to various example embodiments, the at least one waterproof member may include a first waterproof member disposed between the FPCB and the additional layer.

According to various example embodiments, the first waterproof member may be disposed to surround both the light emitting structure and the light receiving structure in a closed loop.

According to various example embodiments, the at least one waterproof member may include a second waterproof member disposed between the additional layer and the housing.

According to various example embodiments, the second waterproof member may be disposed to surround the FPCB in a closed loop.

According to various example embodiments, the additional layer may include at least one polymer member comprising a polymer material (e.g., the polymer members 441 and 442 in FIG. 4) disposed on the rear surface of the display panel, at least one functional member (e.g., the functional member 443 in FIG. 4) disposed on a rear surface of the at least one polymer member, and a conductive member comprising a conductive material (e.g., the conductive member 444 in FIG. 4) disposed on a rear surface of the at least one functional member.

According to various example embodiments, the electronic device may further include a cover (e.g., the cover member 320 in FIG. 7) disposed on at least a portion of the housing, and the display panel may be disposed to be at least partially visible at least in part from the outside through the cover.

According to various example embodiments, the optical sensor module may include at least one of a camera, an ultraviolet (UV) sensor, an iris sensor, a spectroscopic sensor, an infrared (IR) sensor, a red-green-blue (RGB) sensor, and/or a time-of-flight (TOF) sensor.

According to various example embodiments, the display panel may have an opening (e.g., the opening 4301 in FIG. 8) provided at a position overlapping the light receiving structure when the display panel is viewed from above.

According to various example embodiments, an electronic device (e.g., the electronic device 700 in FIG. 7) may include a housing (e.g., the housing 310 in FIG. 7), a display (e.g., the display 400 in FIG. 7), and an optical sensor module (e.g., the optical sensor module 500 in FIG. 7). The housing may include a transparent cover (e.g., the front cover 320 in FIG. 7). The display may be disposed in an inner space (e.g., the inner space 7001 in FIG. 7) of the housing and be at least partially visible from an outside through the transparent cover, and include a display panel (e.g., the display panel 430 in FIG. 7) including a display area (e.g., the display area 431 in FIG. 7), a first non-display area (e.g., the first non-display area 4321 in FIG. 7) disposed adjacent to at least a peripheral portion of the display area, and a second non-display area (e.g., the second non-display area 4322 in FIG. 7) disposed adjacent to at least a peripheral portion of the first non-display area, and at least one additional layer (e.g., the additional layer 440 in FIG. 7) disposed on a rear surface of the display panel. The optical sensor module may be disposed in the inner space attached to a rear surface of the additional layer, and include a flexible printed circuit board (FPCB) (e.g., the FPCB 520 in FIG. 7), a light emitting structure comprising light emitting circuitry (e.g., the light emitting structure 501 in FIG. 7) disposed on the FPCB at least partially overlapping the first non-display area when the display is viewed from above, and a light receiving structure comprising light receiving circuitry (e.g., the light receiving structure 502 in FIG. 7) disposed on the FPCB at least partially overlapping the display area when the display is viewed from above. The display area may have a first transmittance, and the first non-display area may have a second transmittance greater than the first transmittance.

According to various example embodiments, each of the first non-display area and the second non-display area may include driving circuits and wiring structures arranged to control pixels disposed in the display area.

According to various example embodiments, the second transmittance may be based on an arrangement density of the driving circuits and the wiring structures.

According to various example embodiments, the electronic device may further include a printed circuit board (PCB) disposed in the inner space, and the FPCB may be electrically connected to the PCB through an electrical connector.

According to various example embodiments, the electronic device may further include at least one waterproof member comprising a waterproof material surrounding the optical sensor module between the additional layer and the housing.

While the disclosure has been illustrated and described with reference to various example embodiments thereof, it will be understood that the various example embodiments are intended to be illustrative, not limiting. It will further be understood by those skilled in the art that various changes in form and details may be made therein without departing from the true spirit and full scope of the disclosure, including the appended claims and their equivalents.

What is claimed is:

1. An electronic device comprising:
   a housing;
   a display panel disposed in an inner space of the housing to be at least partially visible from an outside through the housing, the display panel including:
   a display area,
   a first non-display area disposed adjacent to at least a peripheral portion of the display area, and
   a second non-display area disposed adjacent to at least a peripheral portion of the first non-display area; and
   an optical sensor module disposed in the inner space at least partially overlapping the display panel, and including:
   a flexible printed circuit board (FPCB),
   a light emitting structure disposed on the FPCB and at least partially overlapping the first non-display area when the display panel is viewed from above, and
   a light receiving structure disposed on the FPCB and at least partially overlapping the display area when the display panel is viewed from above,
   wherein the display area has a first transmittance, and the first non-display area has a second transmittance greater than the first transmittance,
   wherein each of the first non-display area and the second non-display area includes driving circuits and wiring structures arranged to control pixels disposed in the display area,
   wherein the second transmittance is based on an arrangement density of the driving circuits and the wiring structures; and
   wherein the first non-display area has a first arrangement density of the driving circuits and the wiring structures, and the second non-display area has a second arrangement density of the driving circuits and the wiring structures different from the first arrangement density.

2. The electronic device of claim 1, wherein the first transmittance is in a range of 1% to about 4%, and the second transmittance is in a range of 5% to about 10%.

3. The electronic device of claim 1, further comprising:
   a printed circuit board (PCB) disposed in the inner space,
   wherein the FPCB is electrically connected to the PCB through an electrical connector.

4. The electronic device of claim 1, further comprising:
   at least one additional layer disposed on a rear surface of the display panel and having at least one through-hole provided therein,
   wherein the optical sensor module is attached to a rear surface of the additional layer wherein the light emitting structure and the light receiving structure face the at least one through-hole in the additional layer.

5. The electronic device of claim 4, further comprising:
   at least one waterproof member disposed to attach the optical sensor module to the additional layer in the inner space.

6. The electronic device of claim 4, wherein the at least one waterproof member includes a first waterproof member disposed between the FPCB and the additional layer.

7. The electronic device of claim 6, wherein the first waterproof member surrounds both the light emitting structure and the light receiving structure in a closed loop.

8. The electronic device of claim 7, wherein the at least one waterproof member includes a second waterproof member disposed between the additional layer and the housing.

9. The electronic device of claim 8, wherein the second waterproof member surrounds the FPCB in a closed loop.

10. The electronic device of claim 4, wherein the additional layer includes:
    at least one polymer member disposed on the rear surface of the display panel,
    at least one functional member disposed on a rear surface of the at least one polymer member, and
    a conductive member disposed on a rear surface of the at least one functional member.

11. The electronic device of claim 1, further comprising:
    a cover disposed on at least a portion of the housing, wherein the display panel is at least partially visible from the outside through the cover in the inner space.

12. The electronic device of claim 1, wherein the optical sensor module includes at least one of a camera, an ultraviolet (UV) sensor, an iris sensor, a spectroscopic sensor, an infrared (IR) sensor, a red-green-blue (RGB) sensor, and/or a time-of-flight (TOF) sensor.

13. The electronic device of claim 1, wherein the display panel includes an opening provided at a position overlapping the light receiving structure when the display panel is viewed from above.

14. An electronic device comprising:
a housing including a transparent cover;
a display disposed in an inner space of the housing and at least partially visible from an outside through the transparent cover, the display including:
   a display panel including a display area, a first non-display area disposed adjacent to at least a peripheral portion of the display area, and a second non-display area disposed adjacent to at least a peripheral portion of the first non-display area, and
   at least one additional layer disposed on a rear surface of the display panel; and
an optical sensor module disposed in the inner space and attached to a rear surface of the additional layer, the optical sensor module including:
   a flexible printed circuit board (FPCB),
   a light emitting structure disposed on the FPCB at least partially overlapping the first non-display area when the display is viewed from above, and
   a light receiving structure disposed on the FPCB and at least partially overlapping the display area when the display is viewed from above,
wherein the display area has a first transmittance, and the first non-display area has a second transmittance greater than the first transmittance,
wherein each of the first non-display area and the second non-display area includes driving circuits and wiring structures arranged to control pixels disposed in the display area,
wherein the second transmittance is based on an arrangement density of the driving circuits and the wiring structures; and
wherein the first non-display area has a first arrangement density of the driving circuits and the wiring structures, and the second non-display area has a second arrangement density of the driving circuits and the wiring structures different from the first arrangement density.

15. The electronic device of claim 14, further comprising:
a printed circuit board (PCB) disposed in the inner space,
wherein the FPCB is electrically connected to the PCB through an electrical connector.

16. The electronic device of claim 14, further comprising:
at least one waterproof member surrounding the optical sensor module between the additional layer and the housing.

* * * * *